United States Patent [19]

Tivy

[11] 4,403,297
[45] Sep. 6, 1983

[54] PROCESS CONTROL SYSTEM PROVER

[75] Inventor: Vincent V. Tivy, Chagrin Falls, Ohio

[73] Assignee: Loveland Controls Company, Loveland, Colo.

[21] Appl. No.: 222,280

[22] Filed: Jan. 2, 1981

[51] Int. Cl.³ .................... G06F 11/00; G06F 15/20
[52] U.S. Cl. .................................. 364/579; 364/481; 324/73 R
[58] Field of Search ................... 364/579, 580, 481; 324/73 R

[56] References Cited

U.S. PATENT DOCUMENTS

| | | | |
|---|---|---|---|
| 3,665,303 | 5/1972 | Richards et al. | 324/73 |
| 3,705,349 | 12/1972 | Arnold | 324/73 R |
| 3,719,812 | 3/1973 | Bishop et al. | 324/73 X |
| 3,893,024 | 7/1975 | Reines et al. | 324/51 |
| 3,920,973 | 11/1975 | Avellar et al. | 364/579 |
| 3,931,506 | 1/1976 | Borrelli et al. | 324/73 R X |
| 4,055,801 | 10/1977 | Pike et al. | 324/73 R |
| 4,057,847 | 11/1977 | Lowell et al. | 364/200 |
| 4,108,358 | 8/1978 | Niemaszyk et al. | 324/73 AT X |
| 4,155,116 | 5/1979 | Tawfik et al. | 364/579 X |
| 4,180,203 | 12/1979 | Masters | 324/73 R |
| 4,212,075 | 7/1980 | Cleversey et al. | 364/580 |
| 4,224,690 | 9/1980 | Rockwell | 364/580 X |
| 4,270,178 | 5/1981 | Lillig | 364/579 |
| 4,301,536 | 11/1981 | Favin et al. | 364/481 X |

OTHER PUBLICATIONS

3AT-PSU Series Processor Service Units; MI 3A-T-100, Mar. 1978, pp. 1-7.
Spec 200 Calibrator; TI 2AT-300, Mar. 1974, pp. 1-3.
Card Test Module Model 2AT-CTM; MI 2AT-210, Jul. 1975, pp. 1-5.

Primary Examiner—Edward J. Wise
Attorney, Agent, or Firm—Robert C. Dorr

[57] ABSTRACT

An automated process control prover system for (1) performing tasks, including tests, at the circuit loop termination on a termination base located between interconnected control room instrumentation and field equipment, (2) for performing tasks, including tests, to the circuit loop terminations at the control room instrumentation and field equipment locations and (3) for calibration of the field equipment. The prover system includes an improved termination base for allowing selective access to a predetermined number of the circuit loop terminations, a multiplexer for providing the selective access to one of the circuit loop terminations, and a computer for performing the tasks at the termination base. The prover system further includes a portable calibrator for interconnection to the circuit loop terminations at the control room instrumentation and at the field equipment locations which provides a calibration condition to a selected piece of field equipment, wire identification and two-way communication with the multiplexer located at the termination base.

20 Claims, 9 Drawing Figures

CONTROL ROOM | WIRING TERMINATION AREA | FIELD LOCATION

CONTROL ROOM | WIRING TERMINATION AREA | FIELD LOCATION

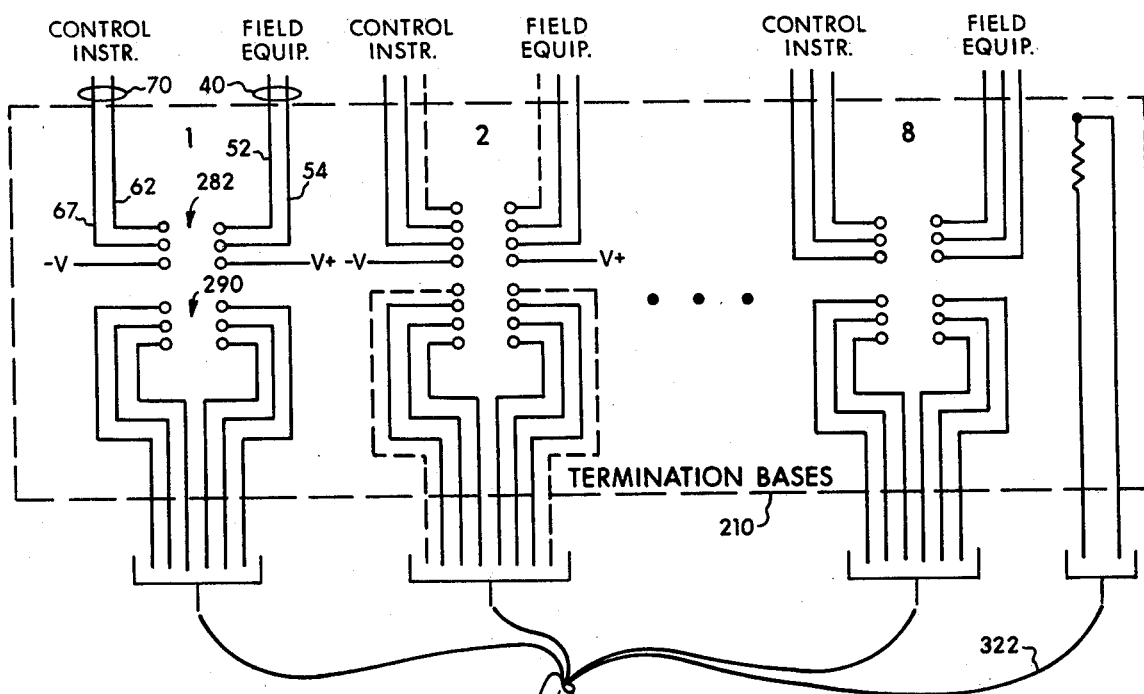
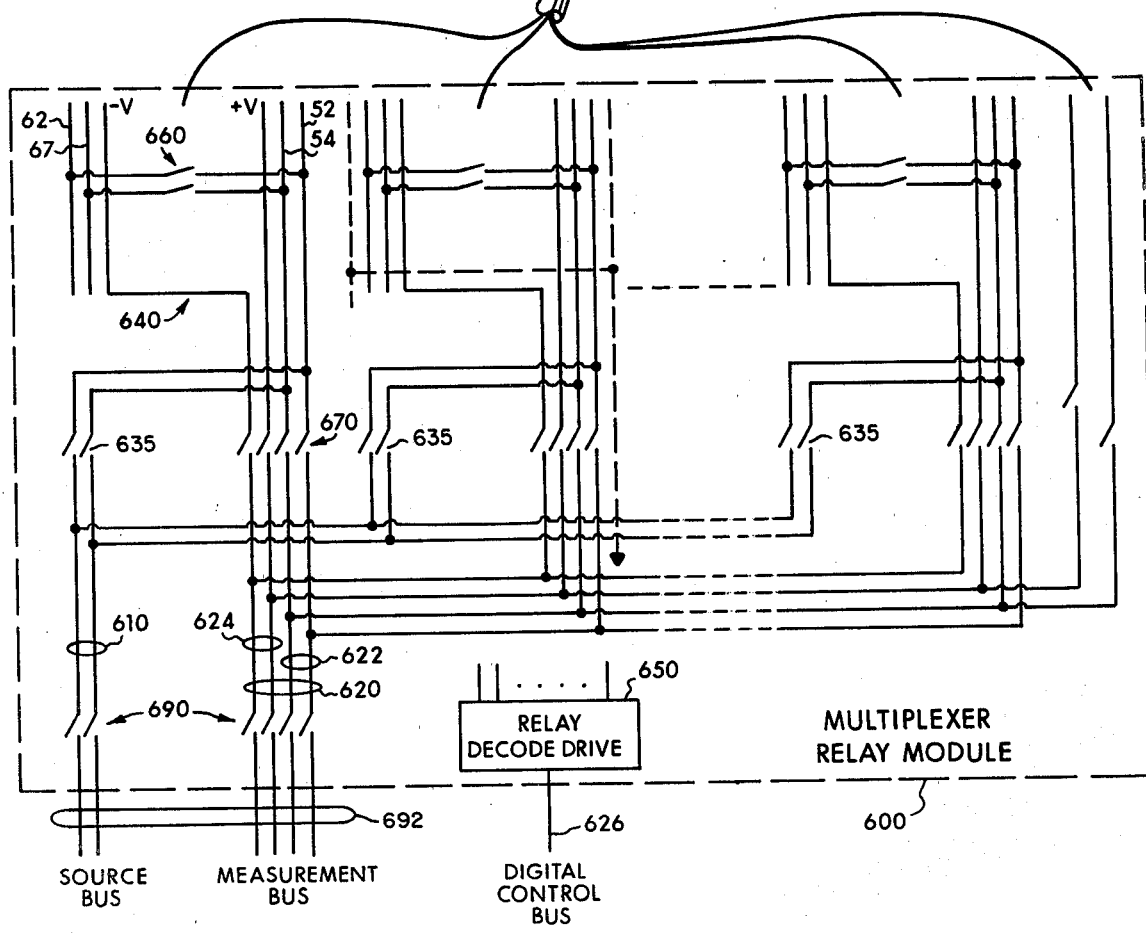
Fig. 7

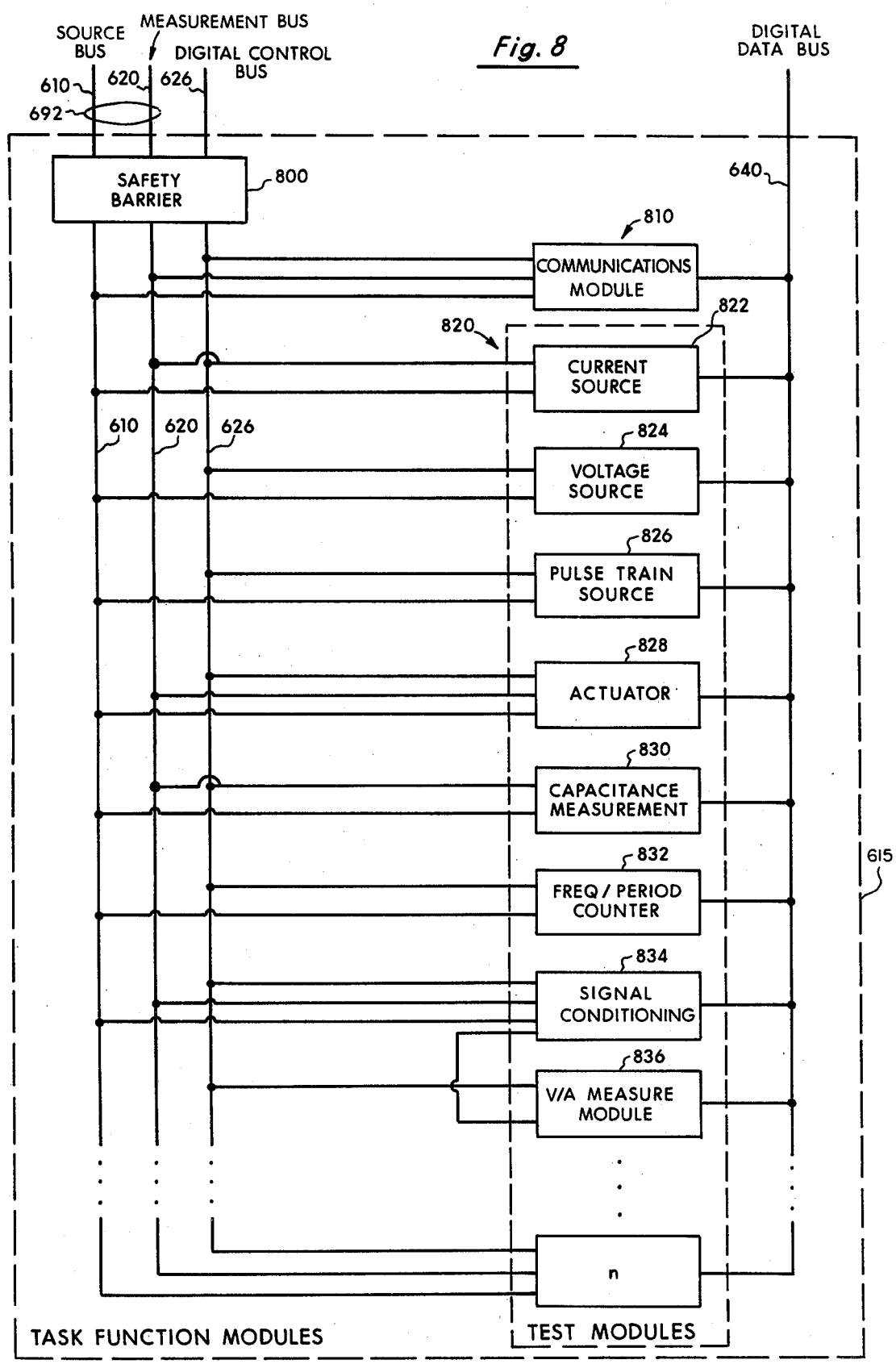

PROCESS CONTROL SYSTEM PROVER

FIELD OF THE INVENTION

The present invention relates to automatic line testers and, more particularly, to testers and calibrators for interconnection with a process control system containing control room instrumentation and field equipment interconnected with termination bases in a termination cabinet.

DISCUSSION OF PRIOR ART

A number of prior patented testing systems were uncovered in the patentability search of the present invention. These prior patent approaches are:

| Patent No. | Inventor |
| --- | --- |
| 3,665,303 | Richards et al |
| 3,705,349 | Arnold |
| 3,719,812 | Bishop et al |
| 3,893,024 | Reines et al |
| 3,931,506 | Borrelli et al |
| 4,055,801 | Pike et al |
| 4,057,847 | Lowell et al |
| 4,108,358 | Niemaszyk et al |
| 4,180,203 | Masters |
| 4,212,075 | Cleversey et al |

The 1972 patent issued to Arnold (U.S. Pat. No. 3,705,349) relates to a computer control for interrogating a wired panel, comparing it to a master wire list stored in the computer, and printing out any wiring errors. The Arnold approach is especially suited for test points or contacts on a computer back panel. The computer applies a voltage to a single set of contacts and a search on the back panel is made for the remaining contacts that exhibit the same voltage by means of sequencing through a relay switching network.

The 1978 patent issued to Niemaszyk (U.S. Pat. No. 4,108,358) relates to a portable circuit tester which is interconnected with the unit to be tested wherein the unit itself contains memory disposed thereon. The unit's memory connects with the portable circuit tester to instruct it as to the appropriate test to be conducted. Typical application for the Niemaszyk approach is in testing digital circuit cards.

The 1976 patent issued to Borrelli, et al (U.S. Pat. No. 3,931,506) sets forth a programmable tester for in-circuit testing of components. The Borrelli approach utilizes a processor to select one of a plurality of stimulation sources through a switch 35 to the circuit terminals. The output terminals of the circuit are then interconnected to one of a plurality of metering devices through a second switching circuit. The 1979 patent issued to Masters (U.S. Pat. No. 4,180,203) is similar to the Borrelli approach in that any individual input pin on the back plane of the system to be tested receives predetermined signals. The Borrelli system then observes the outputs from the other pins. The 1977 patent issued to Pike, et al (U.S. Pat. No. 4,055,801) relates to a similar type of computer control testing in which point by point interrogation occurs.

The 1972 patent issued to Richards, et al (U.S. Pat. No. 3,665,303) relates to a system for automatically and manually testing lines for determining if informtion can be accurately transmitted thereon. The Richards system is hard wired and continually scans cables over which signals are transmitted. Any distortion or deterioration of the signal on the cables will be detected. The 1975 patent issued to Reines, et al (U.S. Pat. No. 3,893,024) relates a method and apparatus for testing the cross points of a multiple stage switching network. The purpose of the Reines approach is to detect faulty cross points in a telephony switching network composed of solid state cross points. The 1973 patent issued to Bishop, et al (U.S. Pat. No. 3,719,812) provides a test system for simulating a dynamic electromagnetic environment involving a number of transmitters located at different distances. The 1977 patent issued to Lowell, et al (U.S. Pat. No. 4,057,847) teaches the use of a maintenance controller for a computer back plane which can either be located on site or remotely. The maintenance controller is provided with means for communication with a central location. The 1980 patent issued to Cleversey (U.S. Pat. No. 4,212,075) is a testing system which receives inserted components for testing the component prior to the component insertion into a printed circuit board.

None of the above prior art approaches uncovered in the patentability search set forth the teachings of the present invention which find its primary application in industrial process control systems such as found in the chemical, oil refining, pulp and paper, and water and waste industries.

In such industrial process control systems, field equipment is typically located at remote field locations throughout a plant. Typically, three classes of field equipment are present: (1) measuring devices such as industrial pressure transmitters, (2) actuators such as alarms, and (3) controllers such as temperature controls. Each piece of field equipment has a circuit loop, hard wired, which is delivered into a termination cabinet or area comprising a plurality of termination bases. These field equipment loops are typically interconnected, at the termination area, with dedicated control room instrumentation over a corresponding control room circuit loop. Control room instrumentation is generally located at a central location within the plant and the control room circut is delivered into the termination area for connection to the field circuit.

The control room instrumentation includes display, monitoring, logging and control instrumentation and devices. The termination area is typically a stand-alone cabinet containing a large number of termination bases for interconnecting the control room circuits (and, hence, control room instrumentation) with the field circuits (and, hence, field equipment). The termination cabinet may be located in the control room or it may be located in a separate area.

There is a need, upon installation of the control room instrumentation and field equipment and their interconnecting loops in an industrial plant, to provide an integrity check of the control room-field terminations which involves the checking of the wiring with a master wiring list, wire ringing, calibration, noise testing, and other tests. These types of tests and integrity checks, are typically necessary to allow transfer of control of an installed process control system from the contractor to the operator of the plant. Furthermore, there is a need to periodically interrogate the integrity of the control room and field loops and to exercise and calibrate the field equipment while the plant is in operation. And, such integrity tests, and calibration should be done under the ambient installed conditions.

Under conventional techniques, these tests are typically time consuming and involve at least two operating personnel—one at the field equipment location and one at the termination base location. No automated testing and calibration system is known to use the termination base location.

Examples of portable discrete equipment to be used to conduct test measurements are the Model SPEC 200 Calibrator for precision measurement of current and voltage signals along with the transmission of these signals, the Model 3AT-PSU Unit for manually controlling, monitoring and testing modules and the Model 2AT-CTM modules for testing the Model SPEC 200—all of which are manufactured by the Foxboro Company.

The present invention provides a solution to these problems by providing a modified termination base in the termination area which allows an automatic testing system to selectively engage a predetermined number of control room instrumentation-field equipment terminations to conduct various tests on the circuits. Furthermore, a portable calibrating unit is provided under the teachings of the present invention which allows a single user to selectively calibrate the field equipment in its environment and to perform a number of tests on the circuits.

Under the teachings of the present invention, a single user or operator can check wiring for continuity, loop resistance, resistance to ground, electrical pickup and conformance with a master tag list. Furthermore, a single user can calibrate differential pressure or flow transmitters, pressure transmitters, temperature and other transmitters, final actuators, controllers, panel mounted instruments, and alarms and other safety devices. And the access provisions of the present invention at the termination area provide for interception of the signal loops or circuits for control system diagnosis, pretuning of controllers, use of training simulators, and connection of standby units.

The general purpose of the process control system prover of the present invention is to assure the plant operator that the control room instrumentation has been properly installed, that all field equipment has been properly calibrated, and that the plant records accurately reflect the details of installation and status of all components. After installation or revamping of the system, ringing and qualification of wiring can easily be performed by using the present invention with less personnel. Because the present invention uses a computer the tests are performed more rapidly and accurately with precise documentation.

Although all instruments in the field equipment are calibrated by the manufacturer prior to shipment, or in the instrument shop after servicing, the present invention allows final calibration and adjustments to occur after installation is complete by assuring that wiring, power supply and load are in the loops under ambient conditions so that the highest accuracy in calibration is obtained. Use of the present invention allows wiring to be completed before calibration, to avoid the problems caused by loose connections that might otherwise be left by the calibration crews. The older practice of transferring data from installation notebooks to handwritten files are eliminated.

The present invention also simplifies instrument servicing and calibration after installation when the plants are shut down for maintenance. And, trouble shooting and system diagnosis can take place while the plants are in operation. Once the trouble is located, standby equipment can be interconnected without disturbing wiring or adversely affecting operations.

DESCRIPTION OF THE DRAWINGS

The features of the present invention will now be particularly described with reference to the accompanying drawings, in which:

FIG. 7 represents the electrical interconnection between the termination base of the present invention and the multiplexer relay modules of the present invention;

FIG. 8 is a block diagram illustration of the task function modules of the present invention.

SUMMARY OF THE INVENTION

The prover system of the present invention includes an improved termination base to which are connected conventional field equipment and their associated control room instrumentation, a multiplexer which manually plugs into a selected number of termination bases to gain access to a predetermined number of control room instrumentation-field equipment terminations, a computer connected to the multiplexer and a portable calibrator which manually attaches to a selected piece of field equipment. The prover system provides many testing functions of which the most important are the following. The portable calibrator can apply wire verification to a selected piece of field equipment which is delivered over the field loop to the termination base of the present invention. The computer when connected to the termination base through the multiplexer can sequentially access each control room instrumentation-field equipment termination pair of terminals until it detects the wire identification signal. At that point, a verification with a master wiring list in the computer is made and verification or non-verification information is delivered from the computer to the multiplexer through the termination base and onto the field equipment loop to which the portable calibrator is attached. The portable calibrator can also provide a calibration condition or physical stimuli such as pressure or temperature to the selected field equipment and deliver an electrical standard calibration signal in digitized format over the field equipment loop back to the computer. The computer reads both the actual transmitted reading appearing on the field equipment loop from the selected piece of field equipment of the applied condition and the digitized standard calibration signal. Any deviations between the standard signal and the transmitted signal will cause the computer to output information over the field equipment loop to the portable calibrator for display in an alphanumeric display so that the user of the portable calibrator can make appropriate calibration adjustments to the selected piece of field equipment. Finally, the prover system of the present invention is capable of performing a series of tasks involving tests to the control room instrumentation and field equipment loops at their connection to the termination base such as but not limited to current tests, voltage tests and capacitance tests.

DETAILED SPECIFICATION

1. Prior Art Wire Termination

Figure 1:
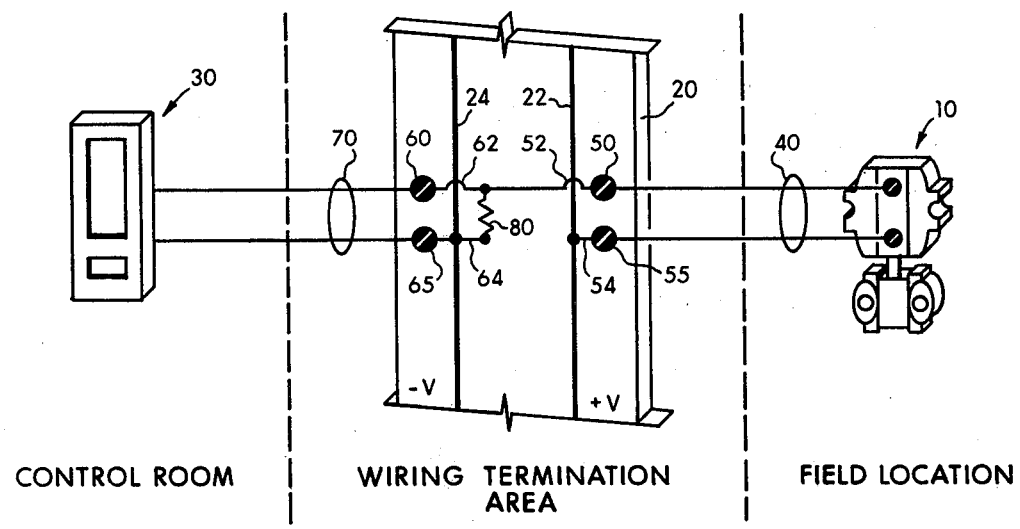
FIG. 1 is an illustration of a prior art interconnection between conventional control room instrumentation and field equipment.

In FIG. 1 is shown a conventional prior art approach for an industrial process control installation involving a plurality of remotely located pieces of field equipment 10, a wiring termination area or distribution base 20 and a plurality of control room instrumentation 30 (which may or may not be remotely located). Typically, in such industrial installations, a large number of field equipment are located at different remote locations at great distances. Each of these field equipment pieces 10 transmits information in the form of electrical signals over loops 40 to interconnect with the termination base 20. The termination base 20, conventionally, comprises a number of terminals 50 and 55 which selectively terminate the loops 40. These terminals 50 and 55 are hard wired to another set of terminals 60 and 65 which interconnect with loops 70 from the control room instrumentation 30.

Although FIG. 1 illustrates only one control room instrument 30 and one piece of field equipment 10, it is to be expressly understood that a number of different types of control room instruments and field equipment devices are conventionally used in an industrial environment. For example, the field equipment device 10 could be a differential pressure sensor which monitors a pressurized process or a flow meter which measures a fluid flow. The pressure or flow readings are then sent over loop 40 through termination base 20 and over loop 70 to the control room instrument 30 where the pressure can be read.

In FIG. 1, a load resistor 80 is used across the control room loop 70 at the termination base 20 to generate a voltage proportional to the condition being sensed by the field equipment 10. In some conventional control room instruments 30 the load resistor and/or the power supply bus (+V and −V) may be contained in the control room instrument 30 and, in those situations, terminal 55 may be connected to terminal 65.

The prior art approach shown in FIG. 1 illustrates a two wire circuit, it is to be understood that all conventional wire loops could be utilized in the teachings of the present invention.

2. General Description of Prover System of Present Invention

Figure 2:
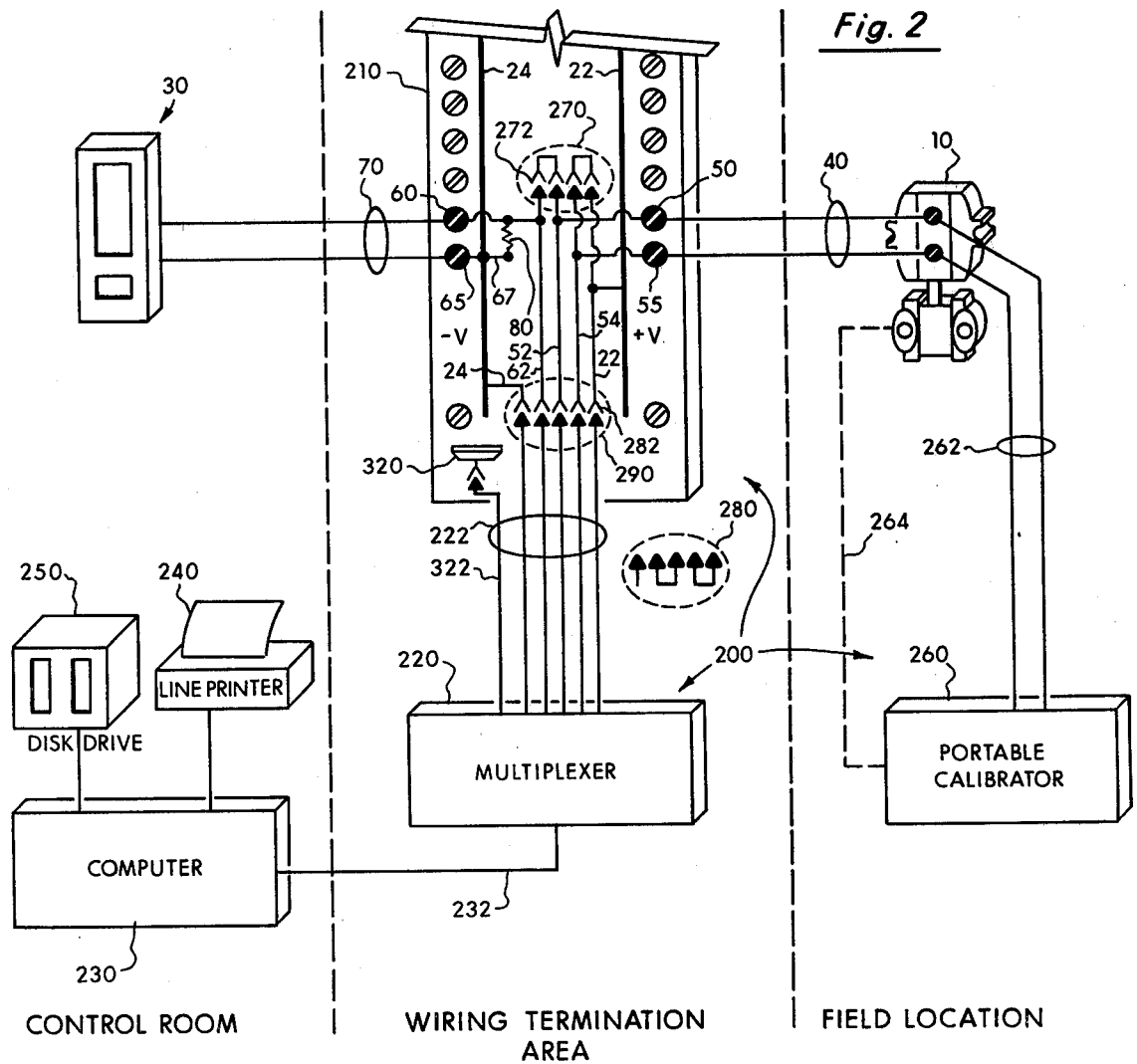
FIG. 2 is an illustration of the various components of the prover system of the present invention interconnected with conventional control room instrumentation and field equipment.

The prover system 200 of the present invention is shown in FIG. 2 to include a termination base 210, a multiplexer 220 interconnected with termination base 210, a computer 230 interconnected with a line printer 240 and a disk drive 250, and a portable calibrator 260. Computer 230, line printer 240 and disk drive 250 are conventional and can comprise any of a number of available systems.

In the event testing of the control room instrumentation and field equipment is not desired, the electrical interconnections function normally. The field equipment 10 is interconnected over loop 40 to terminals 50 and 55 as in the prior art approach. Furthermore, the control room instrument 30 is interconnected over loop 70 to terminals 60 and 65. The connection between terminals 50, 60 and 55, 65 rather than being hard wired as in the prior art approach of FIG. 1 are diverted as shown in FIG. 2 through two pass-through jacks 270 and 280. When pass-through jack 270 engages its corresponding plug 272, the pass-through jack 270 preserves the electrical connections shown in FIG. 1. The removable pass-through jack 280 mates plug 282 and also preserves the interconnection shown in FIG. 1. Jack 270 is redundant which adds an added dimension of security in the event one of the two jacks 270 or 280 is not fully inserted. Provision of a redundant jack 270 and plug 272 is therefore optional. Additional advantages of the redundant pass-through jack 270 and plug 272 will be discussed subsequently.

When the pass-through jacks 270 and 280 are removed, and the multiplexer 220 over cable 222 is interconnected with plug 282 through jack 290, the signals appearing on loop 40 are diverted downwardly into the multiplexer 220 as well as the bus voltages 22 and 24. Additionally, lead 62 which is connected through terminal 70 to the control room instrument 30 is also delivered into the multiplexer 220. Terminal 65 is connected to wire 67 and, in FIG. 2, is not delivered to leads 222. In the event a control room instrument 30 has its own internal load resistor, lead 67 would be delivered into cable 222. Hence, all necessary leads are extended from the termination base 210 through the plug 282-jack 290 connection over cable 222 into the multiplexer 220.

In the remote field location, as shown in FIG. 2, the portable calibrator 260 has a set of leads 262 which manually clip onto the other end of loop 40 at field equipment 10 (or onto loop 70 at control room instrument 30). Additionally, a calibration condition, such as pressure or flow, is provided from the portable calibrator 260 over a mechanical linkage 264 to the field equipment 10. In this mode of operation, the portable calibrator 260 can be utilized to calibrate the field equipment 10. The portable calibrator generates and delivers a known pressure or flow (or any other) condition, for example, over mechanical linkage 264 to the sensing portion of field equipment 10. The amount of pressure or flow is also digitized by the portable calibrator and delivered over leads 262 and loop 40 into the multiplexer 220 as a standard calibration signal. The computer 230 compares the standard pressure calibration signal being delivered with the pressure reading delivered on loop 40 and transmits a communication signal relating to calibration information back over cable 222, loop 40, and leads 262 into the portable calibrator 260 which drives an alphanumeric display to inform the user of the portable calibrator 260 how to adjust the field equipment 10 to provide the correct calibrated reading. Hence, the prover system 200 of the present invention provides an accurate calibration test that includes the calibration of the field equipment 10 through the interconnecting loop 40 in its operational environment.

In another mode of operation, the prover or tester 200 of the present invention can provide testing for the loops 40 or 70 which would include continuity testing, loop resistance testing, resistance to ground testing, electrical pickup testing and conformance with a master wiring list. In one aspect of this mode of operation and, as shown in FIG. 2, the portable calibrator 260 provides a signal over leads 262 which is delivered from the field equipment 10 over loop 40 into terminals 50 and 55 and back into the multiplexer 220. The multiplexer 220 as will subsequently be discussed, is capable of scanning a predetermined number of terminals 50 and 55 (or 60 and 65) to ascertain which terminals are receiving the wire signal or tone. The identity of these terminals can be utilized by the computer 230 in a comparison to the wiring tag list information contained in the computer. The multiplexer 220 can also perform a number of the above tests on the loops 40 and 70.

In another mode of operation, the multiplexer 220 and computer 230 can be utilized as a control system backup or as a simulator. For example, when a control room instrument 30 becomes defective, or it is desired to remove the control room instrument 30 from operation for testing purposes, plug 280 can be removed and the multiplexer 220 can be plugged into plug 282. At this time, the redundant pass-through jack 270 still engages plug 272 and hence the control room instrument 30 is still operational. Removing the redundant pass-through jack 270 would disconnect the control room instrument 30 so that the computer 230 would be in full control. This results in a bumpless or smooth transition from control by the control room instrument 30 to control by the computer 230. Hence, the computer 230 provides a backup to the control room instrument 30 which allows a backup control that can be made without disturbing the existing wiring and performance of the entire system and which would allow, for example, complete rearrangement of control room instrumentation 30.

In another mode of operation the redundant pass-through jack continues to engage plug 272; however, the multiplexer 220 is interconnected with the termination base 210. In this mode control room instrument 30 is still interconnected with its field equipment 10 and the computer through multiplexer 220 can evaluate the signals passing between the control room instrumentation and field equipment in an on-line monitor situation.

In another mode of operation, the computer 230 can be utilized during the construction of the physical plant to check out proper installation of all of the loops between the field equipment 10 and the termination bases 210 and between the control room instrumentation 30 and the termination bases 210 by verifying the wiring and by verifying operation of all of the field equipment. This type of verification is especially important to the contractors responsible for the wiring and the installation of the control room instrumentation and the field equipment. The prover system 200 of the present invention permits this type of integrity check. Furthermore, the system can be utilized to generate simulation signals to further verify and check the integrity of the system. Hence, the entire system can be verified and checked prior to plant operation.

Finally, the system 200 of the present invention provides complete system documentation by maintaining a data base containing all relevant design specification which would include wiring tag lists, instrument specification, controller performance, and when and who calibrated each specific piece of field equipment.

3. Termination Base

Figure 3:
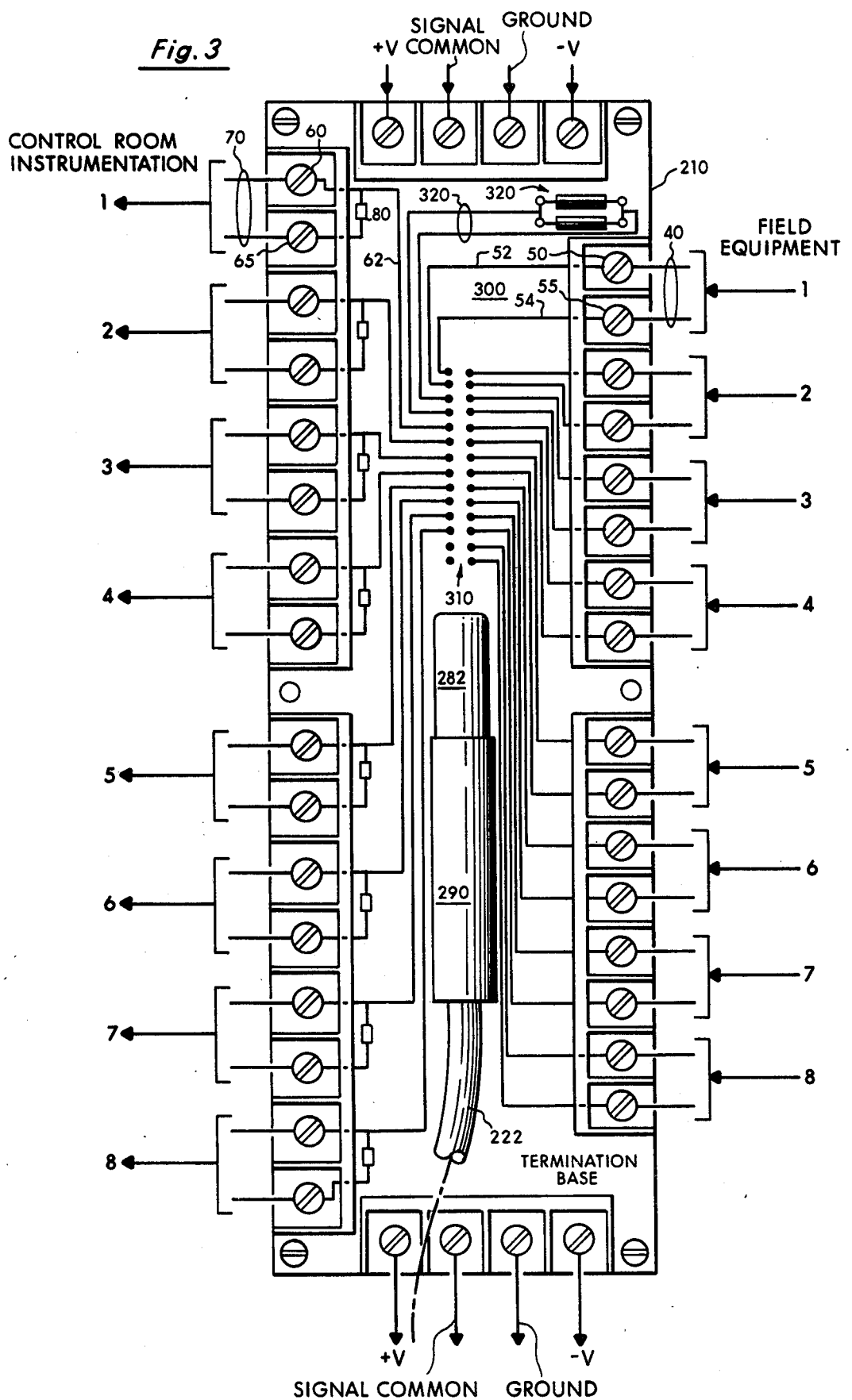
FIG. 3 is an illustration of the configuration of a termination base of the present invention interconnected with eight control room instruments and eight pieces of field equipment.

In FIG. 3 is shown a preferred embodiment of the termination base 210 of the present invention. The termination base 210 is equipped to interconnect with a predetermined number (in the preferred embodiment shown, eight) of different control room instrumentation-field equipment terminations. The termination base 210 includes a printed circuit board 300 which contains the wires 52 and 54 between the terminals 50 and 55 and a wire 62 connected to terminal 60. The cable 222 is shown coupled to a jack 290 which selectively mates with a plug 282. The interconnection between the plug 282 and the printed circuit board 300 occurs on the back plane of the printed circuit board 300 at pins 310. The printed circuit wires and the plug 282 provide electrical outputs for the terminals of a predetermined number of control room instrumentation-field equipment terminations.

The embodiment shown in FIG. 3 does not show the optional redundant pass-through jack 270 and plug 272. The bus connections for plus and minus direct current voltage, signal common, and ground are likewise carried on the back plane and are interconnected both at the top and at the bottom for interconnections to other termination bases 210. The cable 222 extends all of these interconnections.

Each termination base 210 is provided with a unique serial analog code module 320 which comprise a pair of resistors in the preferred embodiment. Analog signals from this serial module 320 are delivered over leads 320 into cable 222. The serial code module 320 provides a unique identification for each particular module 210. The computer 230 can ascertain the identity of the module 210 by reading the code found in the serial module 320. By knowing the identity of the module 210 and by knowing the identity of the pins 310 from the interconnection, the computer 230 can ascertain the identity of each loop 40 and 70, from each control room instrumentation-field equipment termination. The test jack 290 can easily be removed from plug 282 and a pass-through jack 280, not shown in FIG. 3, can be inserted into plug 282 to function as priorly described for FIG. 2. It is to be expressly understood that a digital encoding technique could be utilized under the teachings of the present invention.

Figure 4:
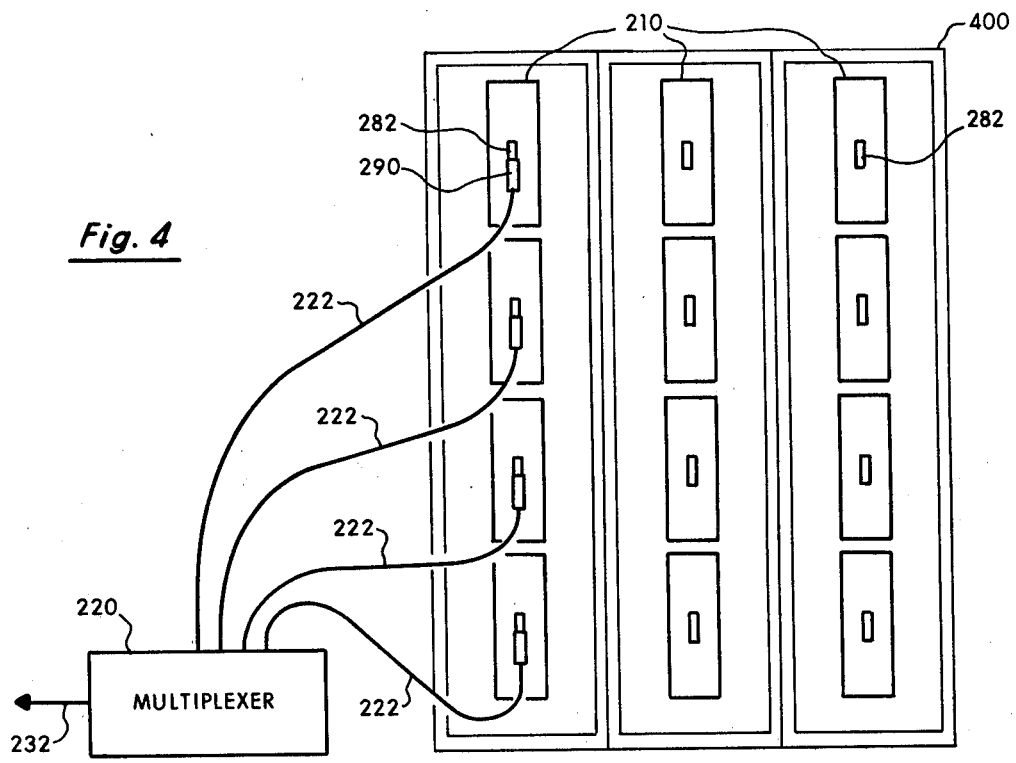
FIG. 4 is an illustration of the multiplexer of the present invention interconnected with the four termination bases shown in FIG. 3 for a total of thirty-two control room instrumentation-field equipment terminations.

The termination bases 210 are conventionally mounted into termination cabinets 400, as shown in FIG. 4. In the preferred embodiment, the multiplexer 220 accesses a predetermined number (in this case four) termination bases 210 by means of cables 222 and jacks 290. In this fashion, thirty-two loops 40 from a total of thirty-two field equipment devices 10 and thirty-two loops 70 from a total of thirty-two control room instruments 30 can be interrogated. After testing of the loops 40 and 70 is accomplished, the jacks 290 can be removed and selectively plugged into the next row of termination bases shown in FIG. 4. It is to be expressly understood that the arrangement shown in FIGS. 3 and 4 could be changed for particular design requirements without departing the teachings of the present invention. Indeed, rather than using a series of terminals 60 and 65, plug and jack connections could be substituted therefore.

4. Portable Calibrator

Figure 5:
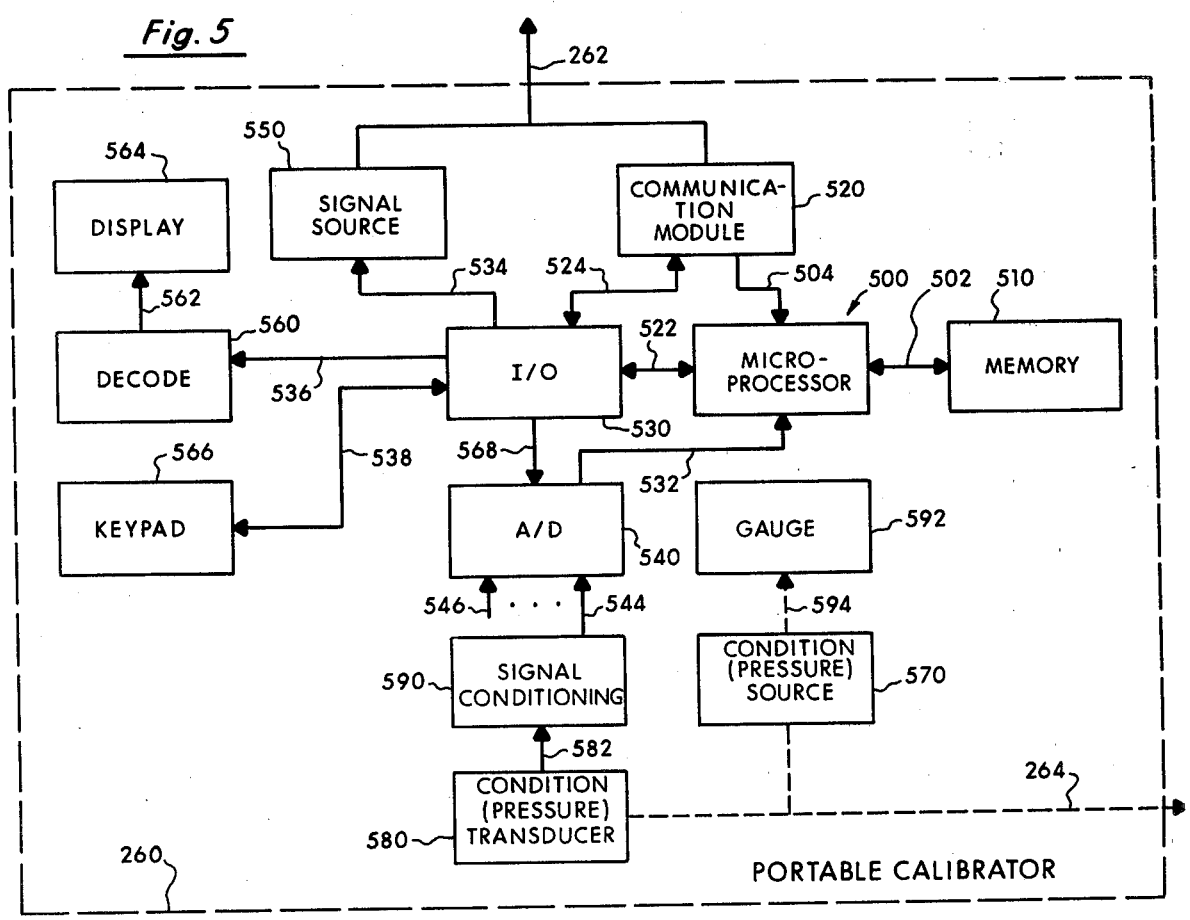
FIG. 5 is a block diagram of the components found in the portable calibrator of the present invention.

In FIG. 5 is shown various electronic components of the portable calibrator 260 of the present invention. The portable calibrator 260 utilizes a microprocessor 500 for overall control of its functions. Memory 510 is provided for the microprocessor 500. The microprocessor communicates with the memory over data and address buses 502. Microprocessor 500 receives an interrupt command over lead 504 from communications module 520. The microprocessor 500 communicates over a bus 522 with an input-output circuit 530. And finally, microprocessor 500 receives information over lead 532 from an analog to digital converter circuit 540.

The communication module 520 is interconnected with leads 262 which, as shown in FIG. 2 interconnects with field equipment 10. The communication module 520 also maintains two-way communication over leads 524 with the input-output circuit 530.

The input-output circuit 530 is further interconnected over leads 534 to a signal source generator 550 which provides the wire identification signal of approximately 10 kilohertz onto leads 262. The input-output circuit 530 is further interconnected over leads 536 to a decode circuit 560 which is further interconnected over leads 562 to a display circuit 564. The display circuit is an alphanumeric display and the decode circuit is a conventional decode and driver circuit for the alphanumeric display. The input-output circuit 530 further communicates over leads 538 with a key pad 556 which is a conventional planer keyboard. Finally, the input-output circuit 530 communicates over lead 568 with the analog to digital converter 540. The input-output circuit provides port expansion for the ports of the microprocessor 500. The analog to digital converter 540 is conventional and functions to receive an analog voltage signal over lead 544.

A pressure source 570 generates a predetermined pressure condition in mechanical linkage 264, which by reference to FIG. 2, accesses the field equipment 10. The pressure condition is also delivered, by means of mechanical linkage 264, into an internal pressure transducer 580 which converts the pressure to an analog electrical signal 582 which is conditioned by a signal conditioning circuit 590 and placed on lead 544 for delivery to the analog to digital converter 540. Additionally, a gage 592 is provided off the pressure source 570 by a separate mechanical linkage 594. The purpose of the gage is to provide the technician with a visual means of assuring that he is reasonably close to the desired value of calibration pressure.

It is to be expressly understood and as represented by lead 546 that other types of standard condition generating sources can be provided for different types of field equipment. For example, a temperature condition could be provided for temperature sensors, a flow condition can be provided for flow sensors, etc. The portable calibrator 260 can be modified, under the teachings of the present invention to provide one or a plurality of different field equipment conditions 570 for different types of field equipment 10. Indeed the preferred embodiment for the portable calibrator could be modified to itself sense, for example, pressure produced by field equipment 10. In this situation field equipment 10 could be a valve control coupled to a pressure sensor. Under commands from the interconnected control room instrument 30 the valve could lower or raise the pressure. The pressure transducer 580 could be interconnected so that the valve in the field equipment is between the source 570 and the transducer 580 in order to measure the valve action on the pressure. In other words the portable calibrator of the present invention could be modified to sense the reaction of the field equipment 10 to applied commands.

In operation, the portable calibrator 260 as shown in FIG. 5 functions to perform wire identification as follows. When leads 262 are interconnected with the field equipment 10, as shown in FIG. 2, a communication path is established between the portable calibrator 260 and the computer 230 of the present invention. The user of the portable calibrator inputs a command on a key pad 560 to instruct the microprocessor 500 to place a test signal on leads 262 from the signal source 550. This test signal is delivered over loop 40 from the field equipment 10 and extended into the multiplexer 220 by cable 222. The multiplexer 220 under control of the computer 230, and as will be subsequently described, searches each of the interconnected predetermined number of termination bases 210 until it detects the wire identification signal from the signal source 550. Once this detection is made, the computer 230 can conduct a number of tests, including the strength of the signal cross-talk on the signal, loop resistance, and continuity. When the computer 230 detects the presence of the signal it can compare the identity of the terminals 50 and 55 with the identifies in a master wire list contained in its memory.

The field equipment 10 can now be calibrated. The operator of the portable calibrator 260 provides a preset standard pressure condition in pressure source 570 which can be read with gage 592. The standard pressure condition is delivered into the pressure transducer 580 to provide an internal reading as to the pressure which is then digitized by the analog to digital converter 540. This digitized standard calibration signal is delivered by the microprocessor to the communication module 520 which in turn delivers it over leads 262 and loop 40 into cable 222 for delivery to the multiplexer 220 and for processing by the computer 230. The computer can then compare the standard calibration signal of the pressure source 570 with the actual sensor reading of the pressure in the mechanical linkage 264. If there are differences in the two readings, the computer will then send this calibration information back over cable 222, loop 40 and leads 262 to the communication module 520 and the microprocessor 500 will process that information and display it in display 564. The operator of the portable calibrator 260 can then make the proper calibration adjustments to the field equipment 10 such as the settings of zero and span. The user of the portable calibrator 260 can, step-by-step, change the pressure source 570 in order to test the integrity of the field equipment 10 over its entire range.

With use of the present invention, the entire range of sensing can be tested and the zero and span settings can be optimized for the entire range or for a selected segment of the entire range. In making these corrections, no "reading" human errors will be injected and the entire history of the field equipment 10 can be retained in the computer file as to who did the calibrations and when the calibration occurred. Furthermore, the field equipment 10 are calibrated in place so that environmental or installation influences are taken into account in the calibration process.

In summary, the portable calibrator 260 removably connects to either the loops 70 at the control room instrumentation 30 or the loops 40 at the field equipment 10. The portable controller has a mode of operation in which the wiring of the control room instrumentation-field equipment interconnections can be verified by connecting the portable calibrator 260 to a loop and applying a wire identification signal to the loop. The multiplexer 230, as will be explained, detects which of the predetermined number of control room instrumentation-field equipment terminations carries the wire identification signal. After detection, the multiplexer transmits a verification signal to the portable module whereupon the operator can go on to the next loop for wire identification testing or, in case of a field equipment loop, whereupon the operator can perform calibration as discussed.

5. Multiplexer

Figure 6:
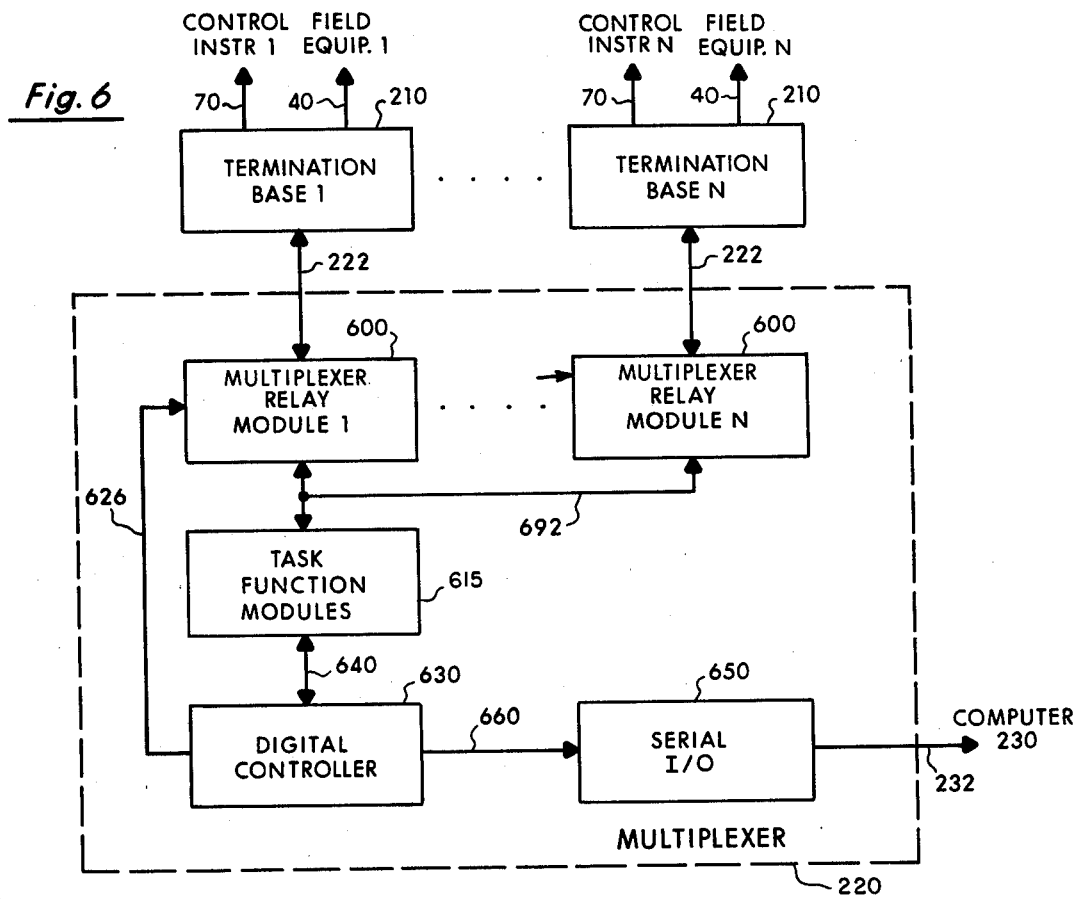
FIG. 6 is a block diagram of the components found in the multiplexer of the present invention.

In FIG. 6 are shown the details of the multiplexer 220. The multiplexer 220 includes a predetermined number of multiplexer relay modules 600 interconnected over cables 222 with the termination bases 210, task function modules 615 interconnected over leads 692 with multiplexer relay modules 600, a digital controller 630 interconnected over buses 640 to the task function modules 615 and to a serial input-output unit 650 interconnected over a bus 660. The digital controller 630 is also interconnected with the multiplexer relay modules 600 over bus 626. The serial input-output 650 is further interconnected over bus 232 with the computer 230.

The operation of the multiplexer 220 is as follows. The digital controller 630 receives commands from the computer 230 through the serial input-output 650. Pursuant to those commands, the digital controller 630 controls the task function modules 615 to provide by means of relays 600, a number of different tests to a selected set of terminals 50, 55 or 60, 65 back through to the field equipment 10 over loop 40 or, in the alternative, back to the control room instrumentation 30 over loop 70. Although FIG. 4 show only four termination bases interconnected with the multiplexer 230, it is to be expressly understood and as shown in FIG. 6, that a predetermined number of termination bases can be accessed by means of separate cables 222, as priorly discussed, with each access requiring a separate relay module 600. Each multiplexer relay module 600 is interconnected over buses 692 to the task function module 615. The operation of the multiplexer is one of a digitally controlled multiplexer wherein a single set of terminals in the termination base 210 can be selected and accessed for two-way communication with the portable calibrator 260 and for testing purposes, as will be discussed in the following.

In FIG. 7 is shown the details of a multiplexer relay module 600 interconnected by means of cable 222 to a termination base 210. The jacks 290 and plugs 282 for eight control room instrumentation-field equipment terminations, as illustrated in FIG. 2, are shown. There is, however, one modification. Since the multiplexer relay module 600 is designed to be more functional, both terminals 60 and 65 for a control room instrument 30 are extended through cable 222 as leads 62 and 67. In FIG. 2 only lead 62 is provided. This type of functionality, however, is useful in some control room instrumentation environments where the load resistor 80 is found in the control room instrument 30 rather than at the termination base 210. Hence, lead 67 can be provided as illustrated in FIG. 7. Likewise, terminals 50 and 55 through leads 52 and 54, respectively, are extended downwardly through cable 222. And finally, the voltages −V and +V on voltage buses 22 and 24 are extended downwardly as shown. Hence, for each control room instrumentation-field equipment termination, six leads are extended downwardly through cable 222 for a total of 48 leads in the preferred embodiment. It is to be expressly understood, that although eight control room instrumentation-field equipment terminations are shown any determined number such as six or ten could have been utilized. The cable 222 is then delivered into the multiplexer relay module 600.

Multiplexer relay module 600 provides a switching network as follows to access one set of terminals from the sixteen sets of terminals in the eight terminations. Two separate buses, a source bus 610 and a measurement bus 620, are outputted from the multiplexer relay module as buses 692. It is desired to interconnect the source bus 610, selectively, with either the control room instrumentation set of terminals 60, 65 or the field equipment set of terminals 50, 55 for each control room instrumentation-field equipment termination. There exists, therefore, a pair of relays 635 for each control room instrumentation-field equipment interconnection designated 640. The source bus 610 has as its goal the selective accessing of either the control room instrumentation terminals 60, 65 or the field equipment terminals 50, 55 for an individual control room instrumentation-field equipment termination. Hence, through selective activation of the relay decode and drive circuit 650, a single pair of relays 635 can be activated for the desired control room instrumentation-field equipment termination. Once selection of the termination has been made, selective activation of the set of terminals 50, 55 or 60, 65 must be made by relays 660. When relays 660 are activated contacts, not shown, break the circuit to contacts 50, 55 over leads 52, 54. Such selective activation places the sorce bus either on the control room instrumentation terminals 60, 65 or the field equipment terminals 50, 55. The source bus 610 has at its function to apply tests onto either the control room instrumentation terminals 60, 65 or the field equipment terminals 50, 55.

The measurement bus 620 serves a different function. A portion of the measurement bus designated 622, like the source bus 610, is designed to be selectively interconnected to the control room instrumentation terminals 60, 65 or the field equipment terminals 50, 55 in order to extend signals from the terminals into the task function modules 610. By selective activation of relays 670, leads 622 can be selectively interconnected to one control room instrumentation-field equipment termination 640. Again, through selective activation of relay 660, the leads 622 can gain access either to terminals 60, 65 or terminals 50, 55. The remaining leads 624 in the measurement bus 620 are interconnected by means of relays 670 to the plus and minus voltage buses 22 and 24.

In this fashion, the switching network provided by the multiplexer relay module 600 can provide access between the source bus 610 and the measurement bus 620 to one of a predetermined number of control room instrumentation-field equipment terminations at the termination base 210. Indeed, other types of switched connections can be made. For example, as shown in FIG. 7, for control room instrumentation-field equipment termination labeled "2" and, as shown in dotted lines, an additional pair of wires can be extended downwardly into cable 222 to be accessed by the measurement bus 620. Such a pair of wires, may be extensions of the ground shield convering loops 40 and 70. This type of interconnection would be utilized when it is desired to test the amount of noise being picked up by the ground shield either from other sources or from the loop protected thereby.

It is to be understood that the relay decode and drive circuit 650 receives a digital code over the digital control bus 626 from the digital controller 630 and that code is conventionally decoded to activate the relays as priorly discussed.

Finally, a set of relays 690 are provided which select the particular multiplexer relay module 600 being accessed. In FIG. 6, a number of different multiplexer relay modules 600 can be utilized. Each are interconnected to the source bus 610 and the measurement bus 620. The proper relay module 600 can be selectively accessed by means of activating relays 690. While the preferred embodiment uses relays, it is to be expressly understood that a solid state network or multiplexer could be used.

In FIG. 8 is shown the task function modules 615 which interconnects with the multiplexer relay modules 600 as best shown in FIG. 6. The task function modules 615 includes a safety barrier 800, a communications module 810, and a plurality of test modules generally designated 820. The function of the task function modules 615, shown in FIG. 8, is to receive digital instructions over the digital control bus 626 and to selectively decode those instructions to perform various tasks. The task function modules function to apply one or a plurality of tasks or tests to the control room instrumentation loop 70 or the field equipment loop 40 through the selective interconnection provided by the multiplexer relay modules 600. Testing or communication information generated is delivered to the digital data bus 640. Furthermore, the task function modules function to communicate with the portable calibrator 260 over the selected loop.

The source bus 610, the measurement bus 620, and the digital control bus 626 access an input safety barrier circuit which prevents the passing of abusive signal levels of large magnitude from the task function modules 615. Conventional resistors, diodes, or fuses can be utilized in this safety barrier circuit 800. The possibility exists that when a particular control room instrumentation-field equipment termination is accessed, an undesirable high voltage may be present in the system of the present invention and the purpose of the safety barrier 800 is to prevent that high voltage from entering into the plant wiring.

The source bus 610, the measurement bus 620, and the digital control bus 626 are thereupon delivered to the communications module 810 and to the test modules 820.

The communications module 810 once selected by a code on the digital control bus 626 inputs data from the digital data bus 640 and outputs a carrier frequency modulated by the digital data. The modulated carrier is then coupled to the source bus 610 by using inductive and capacitive coupling networks. As previously discussed, this modulated digital data is then delivered into the termination base 210 of the present invention and over loop 40 to the field equipment 10 and downwardly into the communication module 520 of the portable calibrator 260 for driving various circuitry in the portable calibrator such as providing display information. The communications module 810 also receives modulated carrier signals back from the communication module 520 of the portable calibrator 260 and demodulates that information for delivery onto the digital data bus 640. Hence, two-way communication between the computer and the portable calibrator can be established.

It is to be expressly understood, under the teachings of the present invention, that although the preferred embodiment utilizes a modulated carrier to carry a signal actually over the sensor loop 40, that a number of different approaches could have been utilized. For example, dedicated separate hard wiring could have been utilized or radio telemetry.

The modules 820 provide measurement tests and in the preferred embodiment includes a current source module 822, a voltage source module 824, a pulse train source module 826, an actuator module 828, a capacitance measurement module 830, a frequency period counter module 832, a signal conditioning module 834, and a V/A measurment module 836. Each of these modules 820 will now be described.

The current source module 822 is an electronic digital to analog converter providing a direct current output. The current applied by the current source module 822 to the source bus 610 can, for example, be continually increasing in amount. When the current source module 822 is digitally accessed by digital control bus 626, the current is applied to a preselected set of terminals at the termination base 210. This current is then affected by what it encounters on the loop (either 40 or 70). The measurement bus 620 can be selectively interconnected across the same set of terminals by the V/A measurement module 836 through the signal conditioning module 834 to measure the resulting voltage appearing across the terminals. This measured voltage can then be delivered from the V/A measurement module 836 onto the digital data bus 640 to the computer. In a preferred embodiment, the current output would be 4–20 mA which would be balanced and stable for any combination of real or complex load impedances.

The voltage source module 824 applies a predetermined amount of voltage to the source bus 610 and, thence, to a selected set of terminals in the termination base 210. The voltage source module 824 is used to send voltages out to the field equipment, or back to the control room instrumentation, to open or close valves, to actuate relays, to sound alarms, etc. In operation, the necessary digital information would appear on bus 640 to access the communications module 810 and to send a message into the display of the portable calibrator 260 to inform the user of the portable calibrator 260 that a particular valve at that location or other field devices will be exercised. The voltage source module 824 would then be activated to apply the voltage to the necessary set of terminals in the termination base 210 by which to activate the valve (or sound the alarm). The user of the portable calibrator 260 would then visually verify that this had in fact occurred and punch in a message by means of key pad 566 which would then be delivered into the multiplexer 220. In this fashion, the computer 230 could exercise and test the field equipment 10 or control room instrumentation 30. In a preferred embodiment a balanced output of three different output voltages ranges are used: 1 to 5 V (programmable with 5 mV resolution), −5 to 35 V (programmable with 25 mV resolution), and 0 to 250 mV (programmable w/50 micro V resolution). Again the voltage source is to be unconditionally stable for any combination of real or complex load impedance.

The pulse train source 826 provides an output pulse train signal with predetermined wave form characteristics to the source bus 610. In some control room instrumentation-field equipment terminations, the control room instrument and the field equipment communicate by means of digital pulses rather than an analog current or voltage signal. Pulse train source module 826 provides the capability of providing this type of signal to the control room instrument and the field equipment either continuously or in burst mode. Hence, the present invention can be adapted to mixed environments where some of the control room instrumentation and field equipment communicate by analog signals and where some of the control room instrumentation and field equipment communicate digitally.

The actuator module 828 essentially provides a floating relay contact closure. In other words, some control room instrumentation and field equipment operate through the closure of a contact. Hence, when a contact closure occurs between terminals 50, 55 on the termination base 210, the field equipment 10 would perform a specific function. Again, upon providing a contact closure, the communications module 810 can convey signals to the user of the portable calibrator 260 so that the user can verify that the function upon closure of the contact has been performed.

The capacitance measurement module 830 is interconnected to the measurement bus 620 to selectively provide a measurement of the differential capacitance found on the measurement bus. For example, when a plant is under construction and a large number of control room instrumentation-field equipment interconnections are being made, the capacitance measurement module 830 can be utilized to measure the capacitance between the terminals 50, 55 or 60, 65 to ascertain whether the capacitance is within a predetermined acceptable value. The preferred embodiment uses full programmable scale ranges of: 0.001 microfarad, 0.1 microfarad, 10 microfarad, 100 microfarad with an error of less than five percent of the reading.

The frequency/period counter module 832 is also interconnected with the measurement bus 620 to selectively measure the wave form frequency and/or the period of the signals present on the measurement bus. This circuit module is utilized to evaluate the digital signals being applied to the field equipment loop 40 by field equipment 10. The signals normally would have been received by the control room instrument 30 and the purpose of the frequency/period counter module 832 is to measure the integrity of those signals as they are being transmitted on the loop.

As mentioned, the signal conditioning module 834 is a combination of amplifiers, antennuators, filters and AC/DC converters in order to present a conditioned signal to the V/A measurement module 836.

Under the teachings of the present invention, at least one measurement test (or any number) can be at the terminals 60, 65 for the control room instrumentation or the terminals 50, 55 for the field equipment. It is to be expressly understood that the testing modules set forth in the preferred embodiment are examples of preferred tests and that any of a number of other modules can be incorporated into the testing system of the present invention.

In summary, the task function modules 610 of the present invention, in cooperation with the multiplexer relay module 600 and the termination board 210, function to apply testing signals to the control room instrumentation loop 70 or to the field equipment loop 40 and to measure various conditions thereon. Additionally, the communications module 810 provides a two-way communication path over the loop to the portable calibrator 260. In the situation where the portable calibrator 260 provides the wire identification signal to the field equipment loop 40 or the control room instrumentation loop 70, the signal is passed through the signal conditioning module 834 to provide selective filtering to identify the predetermined tone emitted by the portable calibrator. The output of module 834 is fed to the V/A measurement module 831 to actually read the voltage resulting from the filtered tone as well as the noise voltage other than the tone. This assures detection of the desired tone and not simply high levels of noise. During the wire identification procedure the multiplexer relay unit 600 is being automatically scanned under control of the digital controller 630 and "looks" for the tone on all lines. This assures that the system will detect and verify the wiring interconnections. In the situation where the portable calibrator 260 is applying a pressure condition to the field equipment 210, the value of that pressure detected internal to the portable calibrator 260, as previously discussed, is delivered into the multiplexer 220.

Figure 9:
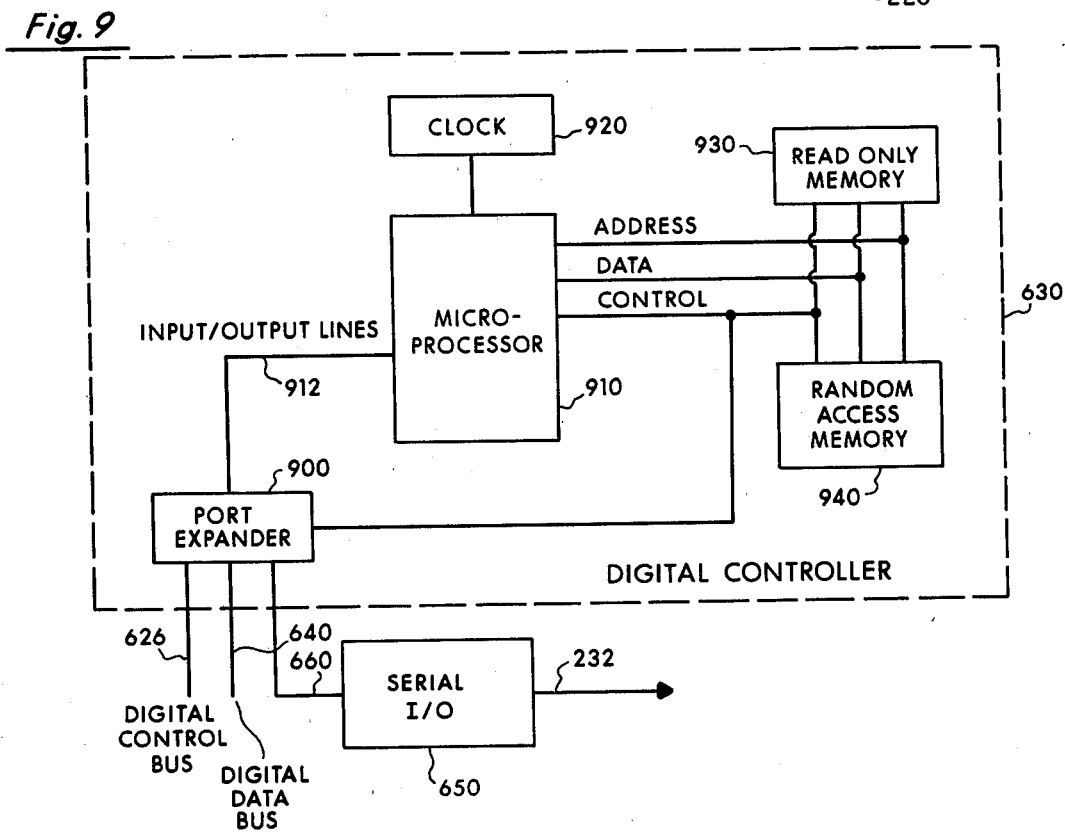
FIG. 9 is a block diagram illustration of the digital controller of the present invention.

In FIG. 9 are shown the details of the digital controller 630 which controls the task function modules 610 and the multiplexer relay modules 600. The digital controller 630 includes a port expander 900, a microprocessor 910, a clock 920, a read only memory 930, and a random access memory 940. The microprocessor 910 communicates over a bus 912 with the port expander 900 to the digital control bus 626, the digital data bus 640, and with the serial input-output 650 over bus 660. Internally, the microprocessor is driven by clock 920 and conventionally accesses memories 930 and 940 to provide the control function.

The digital controller 630 executes a series of predetermined steps to perform the communication function and the task functions in the modules 610. In turn, the digital controller is under control of the computer 230 through the serial input-output circuit 650. The computer 230 issues commands to the digital controller 630 which in turn executes a series of internal commands to perform the particular task. As mentioned, these tasks include the opening and closing of relays in the multiplexer relay module 600 to gain access to either the terminals 60, 65 of the control room instrumentation loop 30 or terminals 50, 55 in the field equipment loop 40. Messages can also be transmitted between the portable calibrator 260 and the computer 230 by means of the digital controller 630. The computer 230 can instruct the digital controller 630 to make measurements of voltage, current, resistance, capacitance, wave form frequency or period in the task function modules unit 610. Furthermore, the computer 230 can instruct the digital controller 630 to cause the task function modules unit 610 to perform signal conditioning such as amplification antennuation and filtering. In the wire identification mode of operation, the user of the portable calibrator 260 applies a tone to a field equipment loop 40 (or a control room instrumentation loop 30) and the computer 230 will instruct the controller 630 to sequentially test each connection to detect the presence of the wire ringing signal. Hence, the computer 230 can verify that the proper wire connection has been performed. Computer 230 can instruct the digital controller 630 to in turn instruct the modules 610 to perform certain calibration tasks that require the application of certain predetermined electrical voltage or current signals to be applied to the control room instrumentation loop 70 or to the field equipment loop 40.

In certain situations, abnormal electrical voltage levels may be present on the control room instrumentation loop wiring 70 or the field equipment loop wiring 40. In these situations, the digital controller 630, under control computer 230, can execute a sequence of steps to automatically detect these abnormal levels by means of the V/A measurement module 836 and if such signals are present the digital controller 630 can be instructed to cause the various module 820 to be disconnected from the measurement bus 620 and from the source bus 610.

Although the present invention has been described with a degree of particularity and in a preferred embodiment it is to be expressly understood that modifications could be made to the preferred embodiment and that the scope of this invention is set forth in the following claims.

I claim:

1. A prover system for a plurality of control room instruments, a plurality of remotely located field equipment, said field equipment including measuring devices, actuators, and controllers, and a termination base; each of said field equipment being connected over a loop to terminals at said termination base, each of said control room instruments being connected over a loop to terminals at said termination base, said field equipment terminals and said control room instrumentation terminals being interconnected with each other at said termination base so that an electrical circuit is established between a given piece of field equipment and an associated control room instrument, said prover system comprising:
   means connected to a predetermined number of control room instrumentation and field equipment loops at said termination base for outputting connections to the control room instrumentation terminals and to the field equipment terminals of each of said predetermined number of loops,
   first means removably mating said output means for providing an electrical connection for each of said predetermined number of loops so that the control room instrumentation terminals and the field equipment terminals are interconnected to preserve said electrical circuits when said first mating means engages said output means, said electrical circuits being disconnected when said first mating means is removed,
   second means removably mating said output means for extending the electrical connections from said control room instrumentation terminals and said field equipment terminals for each of said predetermined number of loops when said second mating means engages said output means,
   means receptive of said extended electrical connections for selectively providing access to one of said predetermined number of control room instrumentation and field equipment loops,
   means interconnected with said providing means for selectively applying at least one measurement test to said one loop, and
   means interconnected with said providing means and said applying means for controlling said selective provision of access to said one loop and for controlling the application of said at least one measurement test.

2. The prover system of claim 1 further comprising portable means for removably connecting to the other end of said one loop at said remote location, said portable connecting means being capable of applying at least one measurement test to said one loop.

3. The prover system of claim 2 wherein said portable connecting means and said controlling means are capable of two-way communication.

4. The prover system of claim 3 wherein said portable connecting means and said controlling means are capable of two-way communication over said one loop.

5. The prover system of claim 2 wherein said portable connecting means further comprises means for generating a calibration condition to the measuring device in the field equipment connected to said one loop, the aforesaid field equipment producing a signal on said one loop for transmittal to said field equipment terminals and for diversion through said extending means to said controlling means, said controlling means being capable of evaluating said transmitted signal for accuracy and for communicating calibration information to said portable connecting means.

6. The prover system of claim 1 further comprising:
   second means connected to said predetermined number of loops at said termination base for outputting the connections to said control room instrumentation terminals and said field equipment terminals, and
   means removably coupling with said second output means for providing a second electrical circuit for each of said predetermined number of loops so that the control room instrumentation terminals and the field equipment terminals of said loops are interconnected when said second mating means engages said second output means and are disconnected when said second mating means is removed, said applying means being capable of selectively applying said at least one measurement test when said second means engages said first output means and when said coupling means engages said second output means.

7. A prover system for a plurality of control room instruments, a plurality of remotely located field equipment, said field equipment including measuring devices, actuators, and controllers, and a termination base; each of said field equipment being connected over a loop to terminals at said termination base, each of said control room instruments being connected over a loop to terminals at said termination base, said field equipment terminals and said control room instrumentation terminals being interconnected with each other at said termination base so that an electrical circuit is established between a given piece of field equipment and an associated control room instrument, said prover system comprising:
   first means connected to a predetermined number of control room instrumentation and field equipment loops at said termination base for outputting connections to the control room instrumentation terminals and the field equipment terminals of each of said predetermined number of loops,
   second means connected to said predetermined number of loops at said termination base for outputting the connections for said control room instrumentation terminals and said field equipment terminals of each of said predetermined number of loops,
   first means removably mating said first output means for providing an electrical connection for each of said predetermined number of loops so that the control room instrumentation terminals and the field equipment terminals are interconnected to preserve said electrical circuits when said first mating means engages said first output means, said electrical circuits being disconnected when said first mating means is removed, second means removably mating said first output means for extending the electrical connections for said control room instrumentation terminals and said field equipment terminals for each of said predetermined number of loops when said second mating means engages said first output means, means removably coupling with said second output means for providing a second electrical circuit for each of said predetermined number of loops so that the control room instrumentation terminals and the field equipment terminals for each of said predetermined number of loops are interconnected when said second mating means engages said second output means and are disconnected when said second mating means is removed, means receptive of said extended electrical connections for selectively providing access to one of said loops, means interconnected with said providing means for selectively applying at least one measurement test to said one loop, means interconnected with said providing means and said applying means for controlling said selective provision of access to said one loop and for controlling the application of said at least one measurement test, portable means for removably connecting to the other end of said one loop at said remote location, said portable connecting means being capable of applying at least one measurement test to said one loop, said portable connecting means and said controlling means being capable of two-way communication, and means in said portable connecting means for generating a calibration condition to the measuring device in the field equipment connected to said one loop, the aforesaid field equipment producing a signal on said one loop for transmittal to said field equipment terminals and for diversion through said extending means to said controlling means, said controlling means being capable of evaluating said transmitted signal for accuracy and for communicating calibration information to said portable connecting means.

8. The prover system of claim 7 wherein said portable connecting means further comprises means for generating a calibration condition to the measuring device in the field equipment connected to said one loop, the aforesaid field equipment producing a signal on said one loop for transmittal to said field equipment and for diversion through said extending means into said controlling means, said controlling means being capable of evaluating said transmitted signal for accuracy and for communicating calibration information to said portable connecting means.

9. The prover system of claim 8 wherein said portable connecting means further comprises:
   means connected to said generating means for sensing said calibration condition and for producing a standard calibration signal, and
   means for communicating said standard calibration signal to said controlling means, said controlling means being capable of comparing said standard calibration signal to said signal from said connected field equipment and for generating said calibration information to said portable connecting means.

10. A prover system for a plurality of control room instruments, a plurality of remotely located field equipment, said field equipment including measuring devices, actuators, and controllers, and a termination base; each of said field equipment being connected over a loop to terminals at said termination base, each of said control room instruments being connected over a loop to terminals at said termination base, said field equipment terminals and said control room instrumentation terminals being interconnected with each other at said termination base so that an electrical circuit is established between a given piece of field equipment and an associated control room instrument, said prover system comprising:

means removably mating with a predetermined number of said control room instrumentation and field equipment loops at said termination base for extending electrical connections to the control room instrumentation terminals and to the field equipment terminals of each of said predetermined number of loops, means receptive of said extended electrical connections for selectively providing access to one of said predetermined number of control room instrumentation and field equipment loops, means interconnected with said providing means for selectively applying at least one measurement test to said control room instrumentation terminals and said field equipment terminals of said one loop, means interconnected with said providing means and said applying means for controlling said selection of said one loop and for controlling the application of said at least one measurement test, and portable means for removably connecting to the other end of said one loop at said remote location, said portable connecting means being capable of applying at least one measurement test to said one loop.

11. The prover system of claim 10 wherein said portable connecting means and said controlling means are capable of two-way communication.

12. The prover system of claim 10 wherein said portable connecting means and said controlling means are capable of two-way communication over said selected controller sensor loops.

13. A prover system for a plurality of control room instruments, a plurality of remotely located field equipment, said field equipment including measuring devices, actuators, and controllers, and a termination base; each of said field equipment being connected over a loop to terminals at said termination base, each of said control room instruments being connected over a loop to terminals at said termination base, said field equipment terminals and said control room instrumentation terminals being interconnected with each other at said termination base so that an electrical circuit is established between a given piece of field equipment and an associated control room instrument, said prover system comprising:

means removably mating with said control room instrumentation and field equipment loops at said termination base for extending the electrical connections to the control room instrumentation terminals and to the field equipment terminals, means receptive of said extended electrical connections for selectively providing access to one of said loops, means interconnected with said providing means for controlling said selective provision of said one loop, and portable means for removably connecting to said one loop at said remote field equipment, said portable connecting means being capable of generating a calibration condition to said connected field equipment, the aforesaid field equipment producing a signal on said one loop for transmittal to said controlling means, said controlling means being capable of evaluating said transmitted signal for accuracy and for communicating calibration information to said portable connecting means.

14. The prover system of claim 13 wherein portable connecting means further comprises means for applying a wire identification signal to said one loop, said controlling means being capable of detecting said wire identification signal and for communicating said detection to said portable connecting means.

15. The prover system of claim 13 wherein said portable connecting means comprises:
   means for generating said calibration condition,
   means connected to said generating means for sensing said calibration condition and for producing a standard calibration signal, and
   means for communicating said standard calibration signal to said controlling means, said controlling means being caable of comparing said standard calibration signal to said signal from said field equipment and for generating said calibration information.

16. The testing system of claim 15 further comprising means in said portable connection means for displaying said calibration information.

17. A prover system for a plurality of control room instruments, a plurality of remotely located field equipment, said field equipment including measuring devices, actuators, and controllers, and a termination base; each of said field equipment being connected over a loop to terminals at said termination base, each of said control room instruments being connected over a loop to terminals at said termination base, said field equipment terminals and said control room instrumentation terminals being interconnected with each other at said termination base so that an electrical circuit is established between a given piece of field equipment and an associated control room instrument, said prover system comprising:
   means removably mating with a predetermined number of control room instrumentation and field equipment loops at said termination base for extending electrical connections to the control room instrumentation terminals and to the field equipment terminals of each of said predetermined number of loops,
   means receptive of said extended electrical connections for selectively providing access to one of said predetermined number of loops,
   means interconnected with said providing means for selectively applying at least one measurement test to said control room instrumentation terminals and said field equipment terminals of said one loop, and
   means interconnected with said providing means and said applying means for controlling said selection of said one loop and for controlling the application of said at least one measurement test.

18. A prover system for a plurality of control room instruments, a plurality of remotely located field equipment, said field equipment including measuring devices, actuators, and controllers, and a termination base; each of said field equipment being connected over a loop to terminals at said termination base, each of said control room instruments being connected over a loop to terminals at said termination base, said field equipment terminals and said control room instrumentation terminals being interconnected with each other at said termination base so that an electrical circuit is established between a given piece of field equipment and an associated control room instrument, said prover system comprising:
   portable means for removably connecting to a selected one of said control room instrumentation and field equipment loops at the location of said control room instrumentation and field equipment, said connecting means being capable of applying at least one measurement test to said connected field equipment loop,
   means removably mating with a predetermined number of said control room instrumentation and field equipment loops at said termination base for extending the electrical connections for each of said predetermined number of loops,
   means receptive of said extended electrical connections for detecting which of said control room instrumentation and field equipment terminals has had at least one test applied thereto in said predetermined number of loops,
   means interconnected with said detecting means for evaluating the effects of said at least one test, and
   means interconnected with said detecting means and said evaluating means for controlling said detection and for controlling the evaluation of said effects of said at least one test.

19. A prover system for a plurality of control room instruments, a plurality of remotely located field equipment, said field equipment including measuring devices, actuators, and controllers, and a termination base; each of said field equipment being connected over a loop to terminals at said termination base, each of said control room instruments being connected over a loop to terminals at said termination base, said field equipment terminals and said control room instrumentation terminals being interconnected with each other at said termination base so that an electrical circuit is established between a given piece of field equipment and an associated control room instrument, said prover system comprising:
   means removably mating with a predetermined number of said control room instrumentation and field equipment loops at said termination base for extending the electrical connections to the control room instrumentation terminals and to the field equipment terminals,
   portable means for removably connecting to a selected one of said control room instrumentation and field equipment loops at the location of said control room instrumentation and field equipment, said portable connecting means being capable of applying a wire identification signal to said selected loop,
   means receptive of said extended electrical connections for detecting said wire identification signal in said predetermined number of loops, and
   means interconnected with said detecting means for communicating said detection to said portable connecting means.

20. The prover system of claim 19 wherein said communicating means is capable of communication over said selected loop.

* * * * *